United States Patent
Grzelakowski

(10) Patent No.: US 6,667,477 B2
(45) Date of Patent: Dec. 23, 2003

(54) EMISSION ELECTRON MICROSCOPE

(76) Inventor: Krzysztof Grzelakowski, Uznamska 8, PL-54-316, Wroclaw (PL)

( * ) Notice: Subject to any disclaimer, the term of this patent is extended or adjusted under 35 U.S.C. 154(b) by 0 days.

(21) Appl. No.: 10/204,643
(22) PCT Filed: Feb. 5, 2001
(86) PCT No.: PCT/PL01/00010
§ 371 (c)(1), (2), (4) Date: Aug. 20, 2002
(87) PCT Pub. No.: WO01/61725
PCT Pub. Date: Aug. 23, 2001

(65) Prior Publication Data
US 2003/0010915 A1 Jan. 16, 2003

(30) Foreign Application Priority Data
Feb. 20, 2000 (PL) .................................. 338538

(51) Int. Cl.$^7$ .............................................. H01J 37/28
(52) U.S. Cl. ...................................................... 250/310
(58) Field of Search ................................ 250/310, 311, 250/309, 397, 396 R

(56) References Cited

U.S. PATENT DOCUMENTS

| | | | |
|---|---|---|---|
| 4,255,661 A | | 3/1981 | Liebl |
| 4,564,758 A | | 1/1986 | Slodzian et al. |
| 4,978,855 A | * | 12/1990 | Liebl et al. ................. 250/310 |
| 4,990,776 A | * | 2/1991 | Fushimi et al. ............. 250/310 |
| 5,969,356 A | * | 10/1999 | Grzelakowski ............. 250/310 |
| 6,259,094 B1 | * | 7/2001 | Nagai et al. ................ 250/310 |
| 6,455,848 B1 | * | 9/2002 | Krijn et al. ................. 250/310 |
| 6,479,819 B1 | * | 11/2002 | Hamashima et al. ........ 250/310 |

OTHER PUBLICATIONS

XP 000222863 (Article–American Institute of Physics).
XP002168698 (Article–Analytical Chemistry).
XP002168566 (Article–Springer, Berlin).

* cited by examiner

*Primary Examiner*—John R. Lee
*Assistant Examiner*—Johnnie Smith, II
(74) *Attorney, Agent, or Firm*—R W Becker & Associates; R W Becker

(57) ABSTRACT

In a SEM it is desirable, in given circumstances, to acquire an image of the sample (14) by means of Auger electrons extracted from the sample and traveling back through the bore of the objective lens (8) in the direction opposing the direction of the primary beam. It is know to separate extracted electrons from the primary beam by positioning Wien filters (32, 34) in front of the objective lens (8), the filters being energized in such a way that they do not cause deflection of the primary beam but do not deflect the secondary electrons. This technique cannot be used for Auger electrons, considering their high energy and hence much stronger fields in the Wien filters, thus causing substantial imaging aberrations in the primary beam.

18 Claims, 4 Drawing Sheets

EMISSION ELECTRON MICROSCOPE

BACKGROUND OF THE INVENTION

The subject matter of the invention is an emission electron microscope for the imaging of the surfaces and the angle distribution of the electrons emitted from the surface.

The system of the electrostatic lenses, known from U.S. Pat. No. 4,096,386, is characterized in that one of the lenses, e.g. the first, has a polished, flat electrode that deflects the light into the direction of the surface.

Also known from German patent application DE 198 9003 is an electron optical, imaging photo electron microscope that contains an electrostatic lens system and an image converter, the attribute of which is the suppression or retardation of the electrons.

An instrument and method of calibrating the same for the object imaging are known from U.S. Pat. No. 6,011,262, which is characterized in that the instrument contains a number of apertured diaphragms for the selective generation of the electron optical images. The instrument is also equipped with a Wien filter that enables the illumination with an electron beam.

SUMMARY OF THE INVENTION

The emission electron microscope, which comprises an objective lens having a contrast diaphragm system, a stigmator, and an electron optical imaging system having at least one lens, is additionally provided with a second, independent imaging system that is parallel to the first imaging system, and two electron detectors for the independent receipt of two images: the real image and the image of the angle distribution of the electrons, which is possible by the electronic switching of the potentials of the two deflection elements, which deflect the electron beam about an angle β and −β, and are electron optically separated from one another by double their focal length, whereby each deflection element is comprised of two spherical and concentric electrodes, of which the outermost one has a bore in order to enable the drift of the electrons along the electron optical axis with the deflection being switched off.

The emission electron microscope is also provided with: a localized electron source that is disposed closely adjacent to the electron optical axis of the objective lens and emits the electrons at an angle α to the axis of the objective lens, a contrast diaphragm system in one of the planes that is conjugated to the focal plane of the objective lens, and an image diaphragm system in one of the image planes of the emission electron microscope.

The emission electron microscope is provided in an electron suppressing or retarding system that comprises at least one electrode that simulates a spherical, suppressing central field having a center in the focal point of the objective lens.

The electron source can also become the source for the spin-polarized electrons. In the further embodiment of the emission electron microscope, the deflection system is provided with an electron detector that is disposed after the bore in the outer deflection electrode of the second deflection element and serves for the receipt of the energy spectrum.

In the further variant of the emission electron microscope, which comprises: objective lens, contrast diaphragm system, stigamator, and an imaging system having at least one lens, the emission electron microscope is provided not only with a localized electron source that is disposed closely adjacent to the electron optical axis of the objective lens, and that emits the electrons at the angle α to the axis of the objective lens, as well as a contrast diaphragm system in one of the planes conjugated to the focal plane of the objective lens, and an image diaphragm system in one of the image planes of the system.

The electron suppression or retardation system comprises at least one electrode that simulates a spherical and suppressing central field with the center in the focal point of the objective lens, and in one of the planes correlated to the focal plane of the objective lens there is disposed a contrast diaphragm system.

In the further embodiment, the electron source or the source of the spin-polarized electrons is provided with a deflection.

Coupled with the objective lens of the emission electron microscope, in a mechanical manner, is a piezoquartz driven specimen manipulator that enables the shifting, cooling and heating of the specimen.

An advantageous result of the invention is provided by: the characteristic of the imaging of the specimen surface with electrons from the selected energy range, the possibility of the local measurements of the energy spectrum and the angle distribution of the electrons, the possibility of the simultaneous receipt of the real image and an image of the angle distribution of the electrons correlated thereto. The production of this effect is realized by the use of an electronic optical deflection system that displaces the electron beam in a parallel manner, and the insertion of the electron gun into the system.

BRIEF DESCRIPTION OF THE DRAWINGS

Exemplary embodiments of the invention will be described in greater detail in conjunction with the drawings.

DESCRIPTION OF THE PREFERRED EMBODIMENTS

Figure 1:
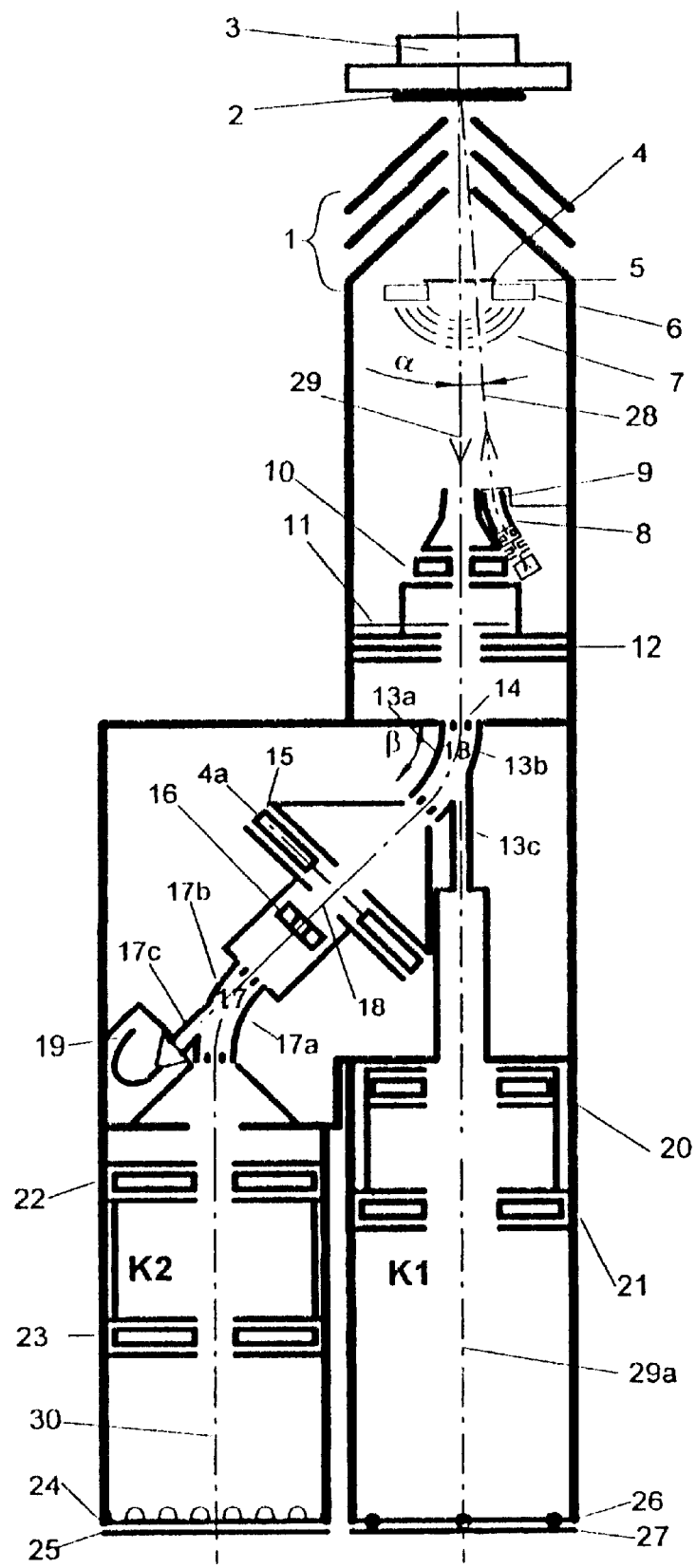
FIG. 1 illustrates an emission electron microscope having two parallel imaging systems, an electron source, and an electron suppression or retardation system.
Figure 2:
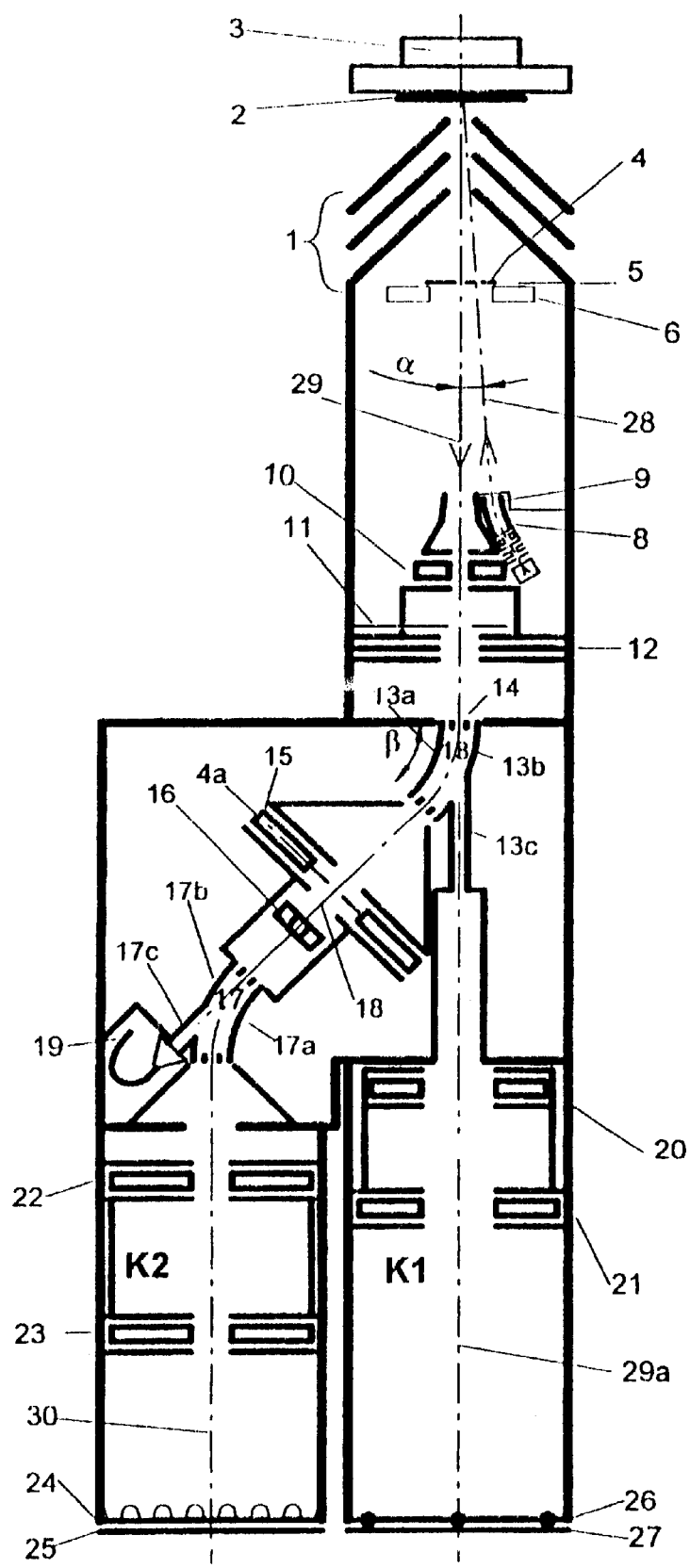
FIG. 2 illustrates an emission electron microscope having two parallel imaging systems and an electron source.
Figure 3:
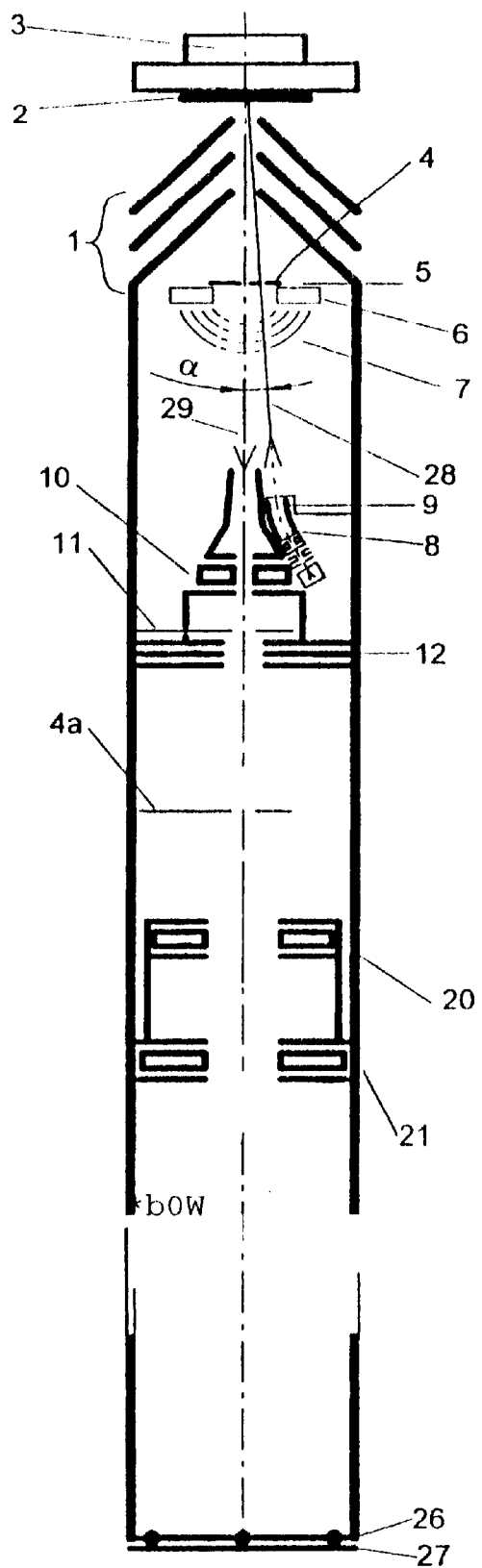
FIG. 3 illustrates an emission electron microscope having an imaging system and an electron source.

The emission electron microscope illustrated in FIG. 1 comprises: an objective lens 1 with a specimen manipulator 3 and containing the contrast apertured diaphragm system 4 and stigmator 6, electron optical lenses 20, 21, 22, 23 in the imaging systems K1 and K2, electron optical lenses 10, 12, electron source 8 with deflection elements 9, and the electron optical deflection system 13 and 17 that displaces the electron beam in a parallel manner and energetically analyzes it. The system that displaces the electron beam in a parallel manner comprises: concentric deflection electrodes 13a, 13b and concentric deflection electrodes 17a, 17b, that are identical thereto and that assume the shape of partial spheres, a lens 15, stigmator 16, and electron detector 19. The first deflection element 13 deflects the electron beam about an angle β that is less than 90°, and the second deflection element 17 deflects the electron beam about an angle-β that leads to its parallel displacement. At the edges of the deflection elements 13 and 17 the annular electrodes 14 can be installed that simulate a spherical field produced by the deflection elements. Both deflection elements 13 and 17 are electron optically spaced from one another by double their focal length, and form an electron optical system in the center of symmetry of which is disposed an electron optical lens 15. Parallel displacement of an electron optical axis 29, 30 at the input and output of the system enables the observation of the microscopic image in two imaging systems K1 and K2. With a specific setting of lens 10 and the deflection element 13 switched off, via the bore 13c in the outer electrode 13b of the deflection element, electrons pass into the imaging system K1, where in the case of the single crystalline specimen 2 it generates a diffraction image, and in the case of the polycrystalline specimen it generates an image of the angle distribution of the electrons, whereby after the appropriate alteration of the setting of the lenses, a real image of the surface results.

With the deflection elements 13 and 17 switched on, the electron beam is subjected to a dual deflection, i.e. parallel displacement of the electron optical axis, and is thereby conveyed into the imaging system K2, which leads to the energetic selective imaging of the specimen surface with the electron detector 25.

The alternating switching on and off of the electron optical deflection elements 13 and 17 at specific voltages with a switching period shorter than the intensity drop of the two electron detectors 25, 27 leads to the detectors simultaneously showing two images:
1) a real image that is energetically filtered by the adjustment of the deflection element 13 and of the lens 15, and an image of the angle distribution of the electrons (a diffraction image), or
2) a real image that is energetically filtered by the adjustment of the deflection element 13 and of the lens 15, and a real image produced by all emitted electrons.

Disposed in the interior of the objective lens 1 is a piezoelectrical mechanism of the contrast diaphragms 4 and stigmator 6, which corrects the image errors of the objective lens.

The suppression or retardation system 7, which comprises a single or several electrodes, and that simulates a spherical central field with a center in the focal point (or in a point electron optically correlated therewith) of the objective lens 1, enables the improvement of the energy scattering capacity of the deflection element 13 via the reduction of drift energy of the electrons in the emission electron microscope.

The electron optical lens 12, the center of which is disposed in the focal plane of the deflection element 13, serves as a field lens that as a function of the operating mode of the emission electron microscope transfers either the diffraction image or the real image into the center of the electron optical lens 15. As a result of the reduction of the image plane 11, it is possible to select a fragment of the image field (even less than $1\mu$) and with the aid of an electron detector 19 to measure the energy spectrum of this selected field (in this case, the deflection element 13 is switched on and 17 is switched off), or with the aid of the electron optical imaging system K1 (in this case the deflection element 13 is switched off) to measure the angle distribution of the electrons from the selected field.

With the deflection element 17 switched off, the electrons drift to the electron detector 19 through the bore 17c in the outer electrode of the deflection element 17b.

With the deflection element 13 switched off, the electrons form a diffraction image or (as a function of the settings of the lenses 10 and 12) a real image (to which all electrons contribute) at the input of the lens 20, which after the enlargement appears upon the electron detector 27.

The switching over of the potentials with the period of e.g. 100 ms leads to the alternating appearance of the images: an energetically selective real image upon the electron detector 25, and an image of the angle distribution of the electrons (or real image to which all electrons contribute) upon the electron detector 27. Utilization of the electronic closure of the two CCD cameras, synchronized e.g. with a control signal having the period e.g. 100 ms, allows the effect of the pulsation of the simultaneously and adjacently appearing images to be avoided.

The primary electron beam passes to the specimen 2 out of the electron source 8, which is disposed closely adjacent to the electron optical axis of the objective lens. Primary electrons that enter into the region of the objective lens at an angle $\alpha$ to the axis thereof, and as a consequence of the application of the objective field to the point of intersection of the objective axis with the specimen are deflected, irradiate or illuminate the specimen at an angle greater than $\alpha$.

The spherical or cylindrical deflection electrodes 9 can be provided at the output of the electron source 8, which reduces the spacing between the electron optical axis 28 of the primary beam and the electron optical axis 29 of the objective lens, and consequently leads to the reduction of the angle of incidence of the electrons on the specimen 2.

Provided in one of the image planes of the system, e.g. in the focal plane of the deflection element 13, is an image apertured diaphragm system 11 with which it is possible to select a fragment of the image portion (also less than 1 $\mu$m) and, with the aid of an electron detector 27 or with some other independent measuring system, e.g. deflection element 13 and electron detector 19, to measure the energy spectrum of the selected portion, or with the aid of the electron optical imaging system K1 to measure the angle distribution of the electrons from the selected portion. A contrast apertured diaphragm (4a) is provided in one of the planes conjugated to the focal plane 5 of the objective lens (e.g. in the center of symmetry of the deflection elements and 17).

Figure 4:
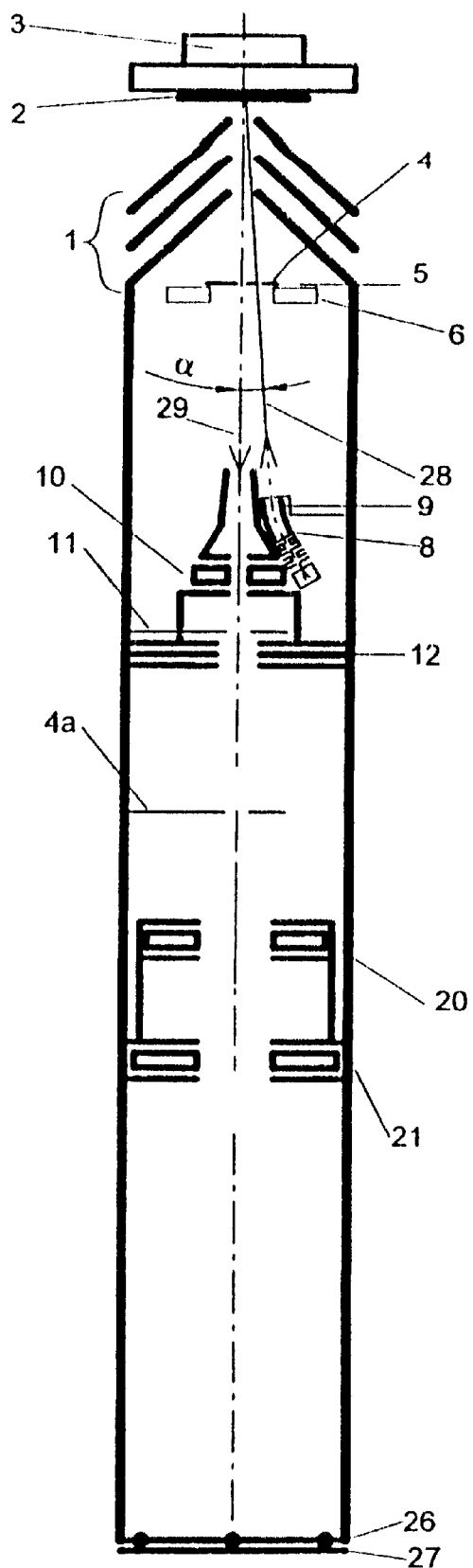
FIG. 4 illustrates an emission electron microscope having an imaging system, electron source, and an electron suppression or retardation system.

The emission electron microscope of FIG. 4 is additionally equipped with a suppression or retardation system 7 that comprises one or more electrodes that simulate a spherical central field with a center in the focal point of the objective lens.

Mechanically coupled to the objective lens of the emission electron microscope is a peizoquartz specimen manipulator that enables a precise displacement, cooling and heating of the specimen.

The emission electron microscope is conceived for use under ultra high vacuum conditions, for which reason all flanges and outer dimensions are subjected to the standard CF. The base flange of the emission electron microscope is an 8" flange DN150CF, which is provided with six mini CF flanges having electrical ducts in two parallel conduits having 2¾" flanges. The overall instrument is covered with a magnetic shielding that protects the slow electrons in the region of the electron optical lenses from the negative influence of the external fields.

This specification incorporates by reference the disclosure of Polish priority document PL 338 538 filed Feb. 20, 2000 and International priority document PCT/PL 01/00010 filed Feb. 5, 2001.

The present invention is, of course, in no way restricted to the specific disclosure of the specification and drawings, but also encompasses any modifications within the scope of the appended claims.

What is claimed is:
1. An emission electron microscope that forms a lens system comprised of an objective lens, a first imaging system having at least one lens, and a stigmator, said microscope further comprising:

a second, independent imaging system that is parallel to said first imaging system;

two electron detectors to detect two independent images, namely a real image and an image of the angle distribution of electrons as a consequence of an electronic switching of potentials of a first and a second deflection element which deflect an electron beam about an angle β and −β, wherein said first and second deflection elements are electron optically separated from one another by double their focal length, wherein said first and second deflection elements are comprised of identical pairs of spherical and concentric electrodes wherein one of said electrodes of said first deflection element is provided with a bore that enables drift of electrons along an electron optical main axis if deflection is switched off;

an electron source disposed closely adjacent to an electron optical axis of said objective lens, wherein said electron source emits primary electrons along an electron optical axis of said electron source 8 at an angle to said electron optical axis of said objective lens;

a contrast diaphragm system in a plane correlated to a focal plane of said objective lens; and an image diaphragm system in an image plane of said lens system.

2. An emission electron microscope according to claim 1, which includes a suppression or retardation system that is comprised of at least one electrode that simulates a suppressing or retarding, spherical central field having a center in a focal point of said objective lens.

3. An emission electron microscope according to claim 2, wherein said electron source is a source for spin-polarized electrons.

4. An emission electron microscope according to claim 3, wherein a deflection element is further disposed at an output of said electron source for electrons.

5. An emission electron microscope according to claim 2, wherein a deflection element is disposed at an output of said electron source.

6. An emission electron microscope according to claim 1, wherein an outer electrode of said second deflection element is provided with a bore, and wherein a further electron detector, for measuring an energy spectrum of emitted electrons, is disposed along an electron optical axis of said second deflection element after said bore of said outer electrode.

7. An emission electron microscope according to claim 3, wherein an outer electrode of said second deflection element is provided with a bore, and wherein a further electron detector, for measuring an energy spectrum of emitted electrons, is disposed along an electron optical axis of said second deflection element after said bore of said outer electrode.

8. An emission electron microscope according to claim 4, wherein an outer electrode of said second deflection element is provided with a bore, and wherein a further electron detector, for measuring an energy spectrum of emitted electrons, is disposed along an electron optical axis of said second deflection element after said bore of said outer electrode.

9. An emission electron microscope according to claim 5, wherein an outer electrode of said second deflection element is provided with a bore, and wherein a further electron detector, for measuring an energy spectrum of emitted electrons, is disposed along an electron optical axis of said second deflection element after said bore of said outer electrode.

10. An emission electron microscope comprising:

an electron optical imaging system provided with an objective lens, at least one projection lens, a stigmator, an electron detector, and a contrast diaphragm system;

an electron source disposed closely adjacent to an electron optical axis of said objective lens, wherein said electron source emits primary electrons along an electron optical axis of said electron source at an angle to said optical axis of said objective lens;

a contrast diaphragm system in a plane correlated to a focal plane of said objective lens; and an image diaphragm system in an image plane of said imaging system.

11. An emission electron microscope according to claim 10, wherein disposed in said imaging system is a system for suppressing or retarding electrons that comprises at least one electrode that simulates a suppressing or retarding, spherical central field having a center in a focal point of said objective lens.

12. An emission electron microscope according to claim 10, wherein a contrast diaphragm system is disposed in a plane that is electron optically conjugated to said focal plane of said objective.

13. An emission electron microscope according to claim 10, wherein said electron source is a source of spin-polarized electrons.

14. An emission electron microscope according to claim 12, wherein said electron source is a source of spin-polarized electrons.

15. An emission electron microscope according to claim 13, wherein said electron source has a deflection element.

16. An emission electron microscope according to claim 14, wherein said electron source for spin-polarized electrons has a deflection element.

17. An emission electron microscope according to claim 10, wherein said electron source has a deflection element.

18. An emission electron microscope according to claim 12, wherein said electron source has a deflection element.

* * * * *